United States Patent
Wang et al.

(10) Patent No.: US 8,390,486 B2
(45) Date of Patent: Mar. 5, 2013

(54) AUTOMATIC OFFSET ADJUSTMENT FOR DIGITAL CALIBRATION OF COLUMN PARALLEL SINGLE-SLOPE ADCS FOR IMAGE SENSORS

(75) Inventors: Yibing Michelle Wang, Temple City, CA (US); Jeff Rysinski, Pasadena, CA (US); Hongyu Wang, San Gabriel, CA (US); Sang-Soo Lee, Cupertino, CA (US)

(73) Assignee: SK Hynix Inc., Gyeonggi-do (KR)

( * ) Notice: Subject to any disclaimer, the term of this patent is extended or adjusted under 35 U.S.C. 154(b) by 99 days.

(21) Appl. No.: 13/118,991

(22) Filed: May 31, 2011

(65) Prior Publication Data

US 2012/0306674 A1    Dec. 6, 2012

(51) Int. Cl.
*H03M 1/06* (2006.01)
(52) U.S. Cl. .................. 341/118; 341/120; 341/155

(58) Field of Classification Search .................. 341/118, 341/120, 155, 158
See application file for complete search history.

(56) References Cited

U.S. PATENT DOCUMENTS

| | | | |
|---|---|---|---|
| 7,151,475 B2 * | 12/2006 | Boemler | 341/155 |
| 7,345,613 B2 * | 3/2008 | Higuchi | 341/155 |
| 7,639,290 B2 * | 12/2009 | Higuchi et al. | 348/243 |
| 8,054,210 B2 * | 11/2011 | Purcell et al. | 341/169 |

* cited by examiner

*Primary Examiner* — Khai M Nguyen
(74) *Attorney, Agent, or Firm* — William Park & Associates Ltd.

(57) ABSTRACT

Various embodiments of the present invention include enabling, during a calibration phase, a counter to count one less than a number of clock periods associated with a determined offset. The counted number of the clock periods is stored in calibration memory. In a conversion phase, inverted outputs are loaded from the calibration memory to the counter, where the counter is enabled to count the clock periods to determine a digital equivalent value of an analog signal amplitude.

26 Claims, 18 Drawing Sheets

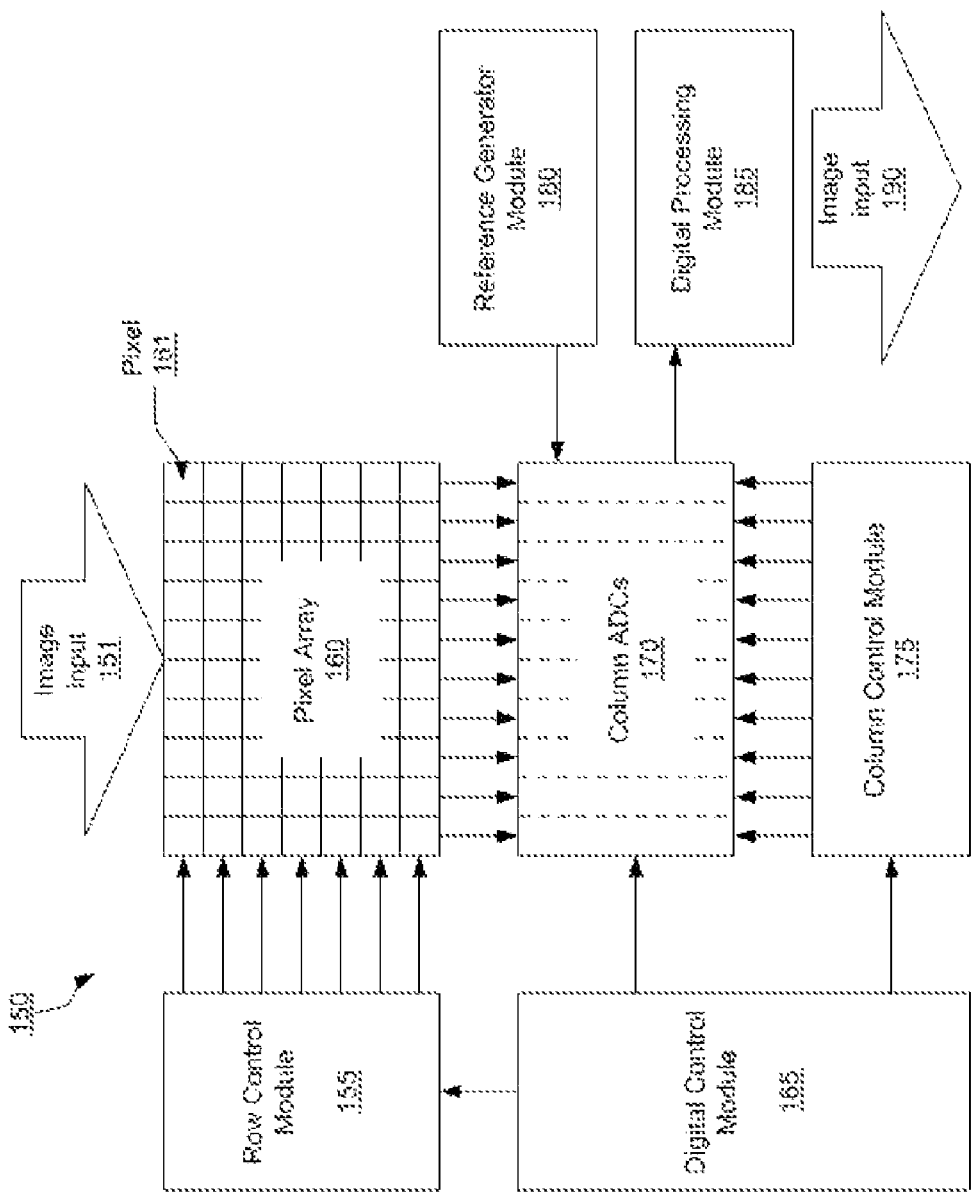

US 8,390,486 B2

AUTOMATIC OFFSET ADJUSTMENT FOR DIGITAL CALIBRATION OF COLUMN PARALLEL SINGLE-SLOPE ADCS FOR IMAGE SENSORS

FIELD OF THE INVENTION

Certain embodiments of the invention relate generally to processing signals, and more particularly to a method and system for digital calibration of column parallel single-slope analog to digital converters (ADCs).

BACKGROUND OF THE INVENTION

As computers and processors become more powerful, more and more signal processing is being done in the digital domain. Digital signal processing can perform complex operations to manipulate input data to approximate real world analog signals, and the operations can be performed in real time, or the digital data can be stored for future processing. Since real world signals exist as analog signals, these analog signals need to be converted to equivalent digital signals.

Analog to digital converters (ADCs) are used in many applications, such as, for example, converting analog control signals in industrial applications, audio signals in music, photographic images in digital cameras, and video images in digital video cameras. As with most circuits, there are many different types of ADCs where tradeoffs are made for different limitations. Some, such as the "flash" ADC, are relatively expensive in circuitry and layout space and, accordingly, limited in resolution since every additional bit requires doubling of the number of comparators, but very fast in conversion speed. Others, such as the ramp ADC, can be fairly simple but slow in conversion time. And as the amount of resolution increases, the conversion time will increase.

Accordingly, a particular application needs to take into account various limitations and determine which design best serves its purposes. However, picking a specific design, and possibly modifying it to improve its design, can still present certain challenges that need to be overcome.

For high resolution and high speed imaging, column parallel ADC architecture has become the most widely used ADC in CMOS image sensors. One key challenge to achieving good performance of CMOS image sensors is to reduce column fixed pattern noise (CFPN) effectively.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the present invention provide a method of using an analog to digital converter (ADC), including applying, during a calibration cycle, an auto-zero voltage to first and second inputs of a comparator in the ADC during an auto-zero period. A first calibration voltage is added to the second input at the end of the auto-zero period, and then a difference voltage is determined between the voltage at the second input at the end of the auto-zero period and the maximum voltage difference able to be determined at the second input during a calibration phase of the ADC. A calibration offset voltage that is greater than the difference voltage is determined, and a second calibration voltage is generated by reducing the first calibration voltage by the calibration offset voltage, where the second calibration voltage is applied to the second input during a conversion cycle.

These and other advantages, aspects and novel features of the present invention, as well as details of an illustrated embodiment thereof, will be more fully understood from the following description and drawings.

BRIEF DESCRIPTION OF THE DRAWINGS

FIG. 1B is a block diagram of an exemplary system for analog to digital conversion that may be used with an embodiment of the invention.

DETAILED DESCRIPTION OF THE INVENTION

Embodiments of the present invention will be described in detail with reference to the accompanying drawings such that the scope of the present invention can be easily embodied by those skilled in the art.

Certain embodiments of the present invention may be found in a method and system for calibrating column parallel analog to digital converters (ADCs).

Figure 1A:
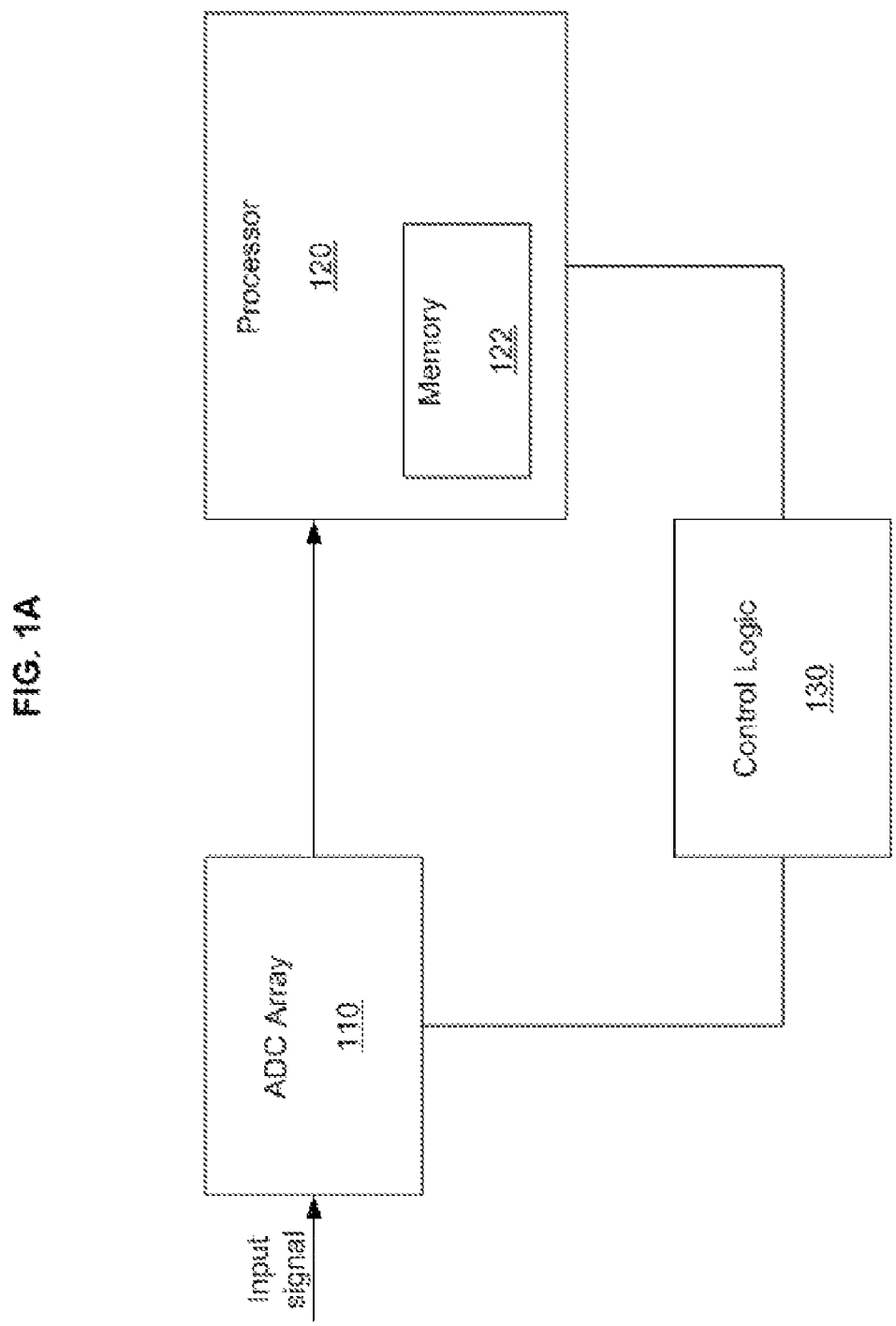
FIG. 1A is a block diagram of an exemplary system for analog to digital conversion that may be used with an embodiment of the invention.

FIG. 1A is a block diagram of exemplary system for analog to digital conversion and digital to analog conversion that may be used with an embodiment of the invention. Referring to FIG. 1A, there is shown a portion of a circuitry for processing input data comprising the ADC array 110, the processor 120, and the control logic 130.

Each ADC in the ADC array 110 converts input analog signals such as, for example, a pixel signal PXL from an image sensor (which, for example, is the circuitry 601 in FIG. 6) to a corresponding digital signal. The digital signals output by the ADC 110 may be further processed by the processor 120. The processor 120 may, for example, use digital signal processing methods to compress the digital signals from the ADC array 110 to a standard video format such as MPEG1, MPEG2, or MPEG4. The processor 120 may also comprise a memory 122 where code and/or other useful data may be stored. This code stored in the memory 122 may be executed by the processor 120 to perform various functions such as, for example, digital signal processing. The memory block 122 may also be used to store digital signals from the ADC 110 and/or digital signals that result from processing the digital signal from the ADC 110.

The control logic 130 may comprise circuitry that generates clocks, control and enable signals, and commands for a variety of modules including the ADC array 110. For example, the control logic 130 may generate a clock signal CLK that is used for counting in an ADC in the ADC array 110 where the clock signal is not continuously running. A running clock comprises pulses while a non-running clock is in either a low state or a high state. The control logic 130 may also output enable signals that enable the counters in the ADC array 110 to count during specific portions of time and also reset signals.

FIG. 1B is a block diagram of exemplary system for analog to digital conversion that may be used with an embodiment of the present invention. Referring to FIG. 1B, there is shown an image processing system 150 that includes a pixel array 160 that may receive analog image input 151 and output a corresponding signal. The signal is converted into a digital representation by column ADCs 170 and passed to a digital processing module 185 for further processing in the digital domain. The digital processing module 185 outputs a digital image output 190, which is a digital representation of the analog image input 151.

Generally, light interacts with each pixel 161 of the pixel array 160 as analog information. The pixels 161 are arranged in rows and columns, which effectively define the resolution of the pixel array 160 and affect the amount of analog image input 151 that is converted by the image processing system 104 into digital image output 190. Various architectures for this type of conversion typically fall into two categories. According to one category, column data from each row of pixels 161 is selected and multiplexed, and the multiplexed data is converted into digital data using a serial ADC approach. According to another category, each row's data is converted column-wise in parallel into digital data by a column-parallel ADC process. FIG. 1B illustrates this second category.

Analog image input 151 is detected at the pixel array 160. A row control module 155 selects each row's data and passes the data to a set of column ADCs 170. Each column ADC 170 processes one column of the row-wise data (i.e., one pixel 161) in parallel according to a column control module 175 to generate corresponding digital data for the row. The row control module 155 and the column control module 175 may be further controlled by a digital control module 165.

Different architectures are available within the column-parallel ADC approach for performing the analog-to-digital conversion. One such approach is known as "single-slope" ADC. According to an exemplary single-slope ADC approach, a reference signal generated by a reference generator module 180 ramps with a certain slope and is compared to a pixel signal generated from the analog image input 151 received by the corresponding pixel 161. The column ADC 170 detects a crossover point at which the ramp signal crosses the pixel signal. This crossover point may be detected using analog or digital techniques. For example, various embodiments may use digital techniques (e.g., counters) to determine a value corresponding to the crossover point.

The reference generator module 180 is typically coupled globally with all the column ADCs 170, so that the column ADCs 170 share a common reference signal. Notably, accuracy of the digital output may be affected by accurate detection of the crossover point, which may, in turn, be affected by movement in the reference level. For example, reference levels may change from pixel 161 to pixel 161 and/or may move according to movement (e.g., noise) in the power supply. Because the reference signal is shared across the column ADCs 170, and the column ADCs 170 act on each row in parallel, movement in the reference signal tends to cause row-wise effects (referred to herein as row-wise noise).

In addition to row-wise noise, the column ADCs 170 may experience column-wise noise. In particular, the column ADCs 170 may typically experience several sources of column-fixed-pattern noise (CFPN) such as variations in pixel source followers, column comparators, counter and line memory timing, skew in the clock, and ramp signals across the array of ADCs, etc. For example, process variations may cause circuit components from one column ADC 170 to another to be slightly different, thereby causing the column ADCs 170 to have slightly different trigger points, hysteresis, delays, etc. Because the column ADCs 170 are shared by all the rows, this CFPN can propagate through the rows, affecting the digital image output 190.

Calibrating the column ADCs 170 to each other can mitigate effects of CFPN sources. Accordingly, typical column ADCs 170 may use an analog and/or digital correlated double sampling (CDS) approach. For example, analog CDS may remove pixel source follower offsets and digital CDS may remove other offsets.

Figure 2:
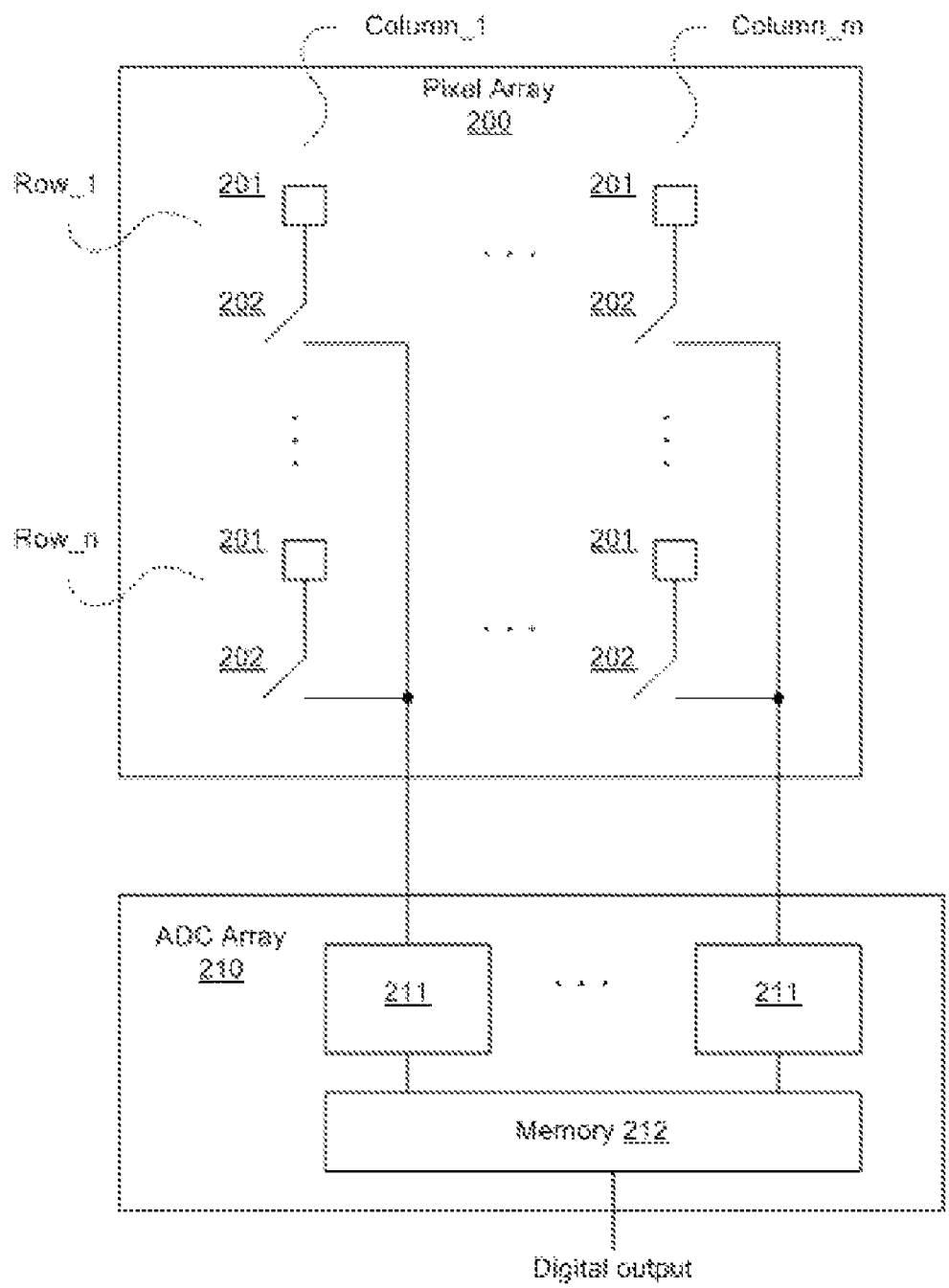
FIG. 2 is a block diagram of an exemplary system for column parallel analog digital converters, in accordance with an embodiment of the present invention.

FIG. 2 is a block diagram of an exemplary column parallel analog digital converter configuration in accordance with an embodiment of the present invention. Referring to FIG. 2, there are shown a pixel array 200 and an ADC array 210. The pixel array 200 may comprise pixel elements 201 and switching elements 202. The pixel elements 201 may comprise suitable circuitry that outputs, for example, voltage proportional to an amount of light detected by the pixel element 201. The pixel element 201 may be sensitive to specific wavelengths of the impinging light. The ADC array 210 may comprise, for example, an array of ADC elements 211, where each ADC element 211 may correspond to a column of the pixel elements 201. The outputs of the ADC elements 211 may be stored in a memory block 212.

In operation, appropriate control signals from, for example, the control logic 130 (FIG. 1A) may enable the switching elements 202 to open and close appropriately so that output voltage from a particular pixel element 201 is communicated to the ADC array 210. Accordingly, for each of the columns Column_1 to Column_m, only one particular switch element 202 in all of the rows Row_1 to Row_n may be closed so that output voltage from the corresponding pixel element 201 is communicated to the ADC array 210.

The output voltage from one of the pixel elements 201 in a column Column_1 to Column_m may be converted to an equivalent digital value by a corresponding ADC element 211. However, since there is a plurality of ADC elements 211, each ADC element 211 may need to be calibrated so that each ADC element 211 outputs a similar digital value for a given input. Calibration may be done periodically, for example, such as once during a row scan time or once during a frame. The particular period for calibration may be design and/or implementation dependent.

Figure 3:
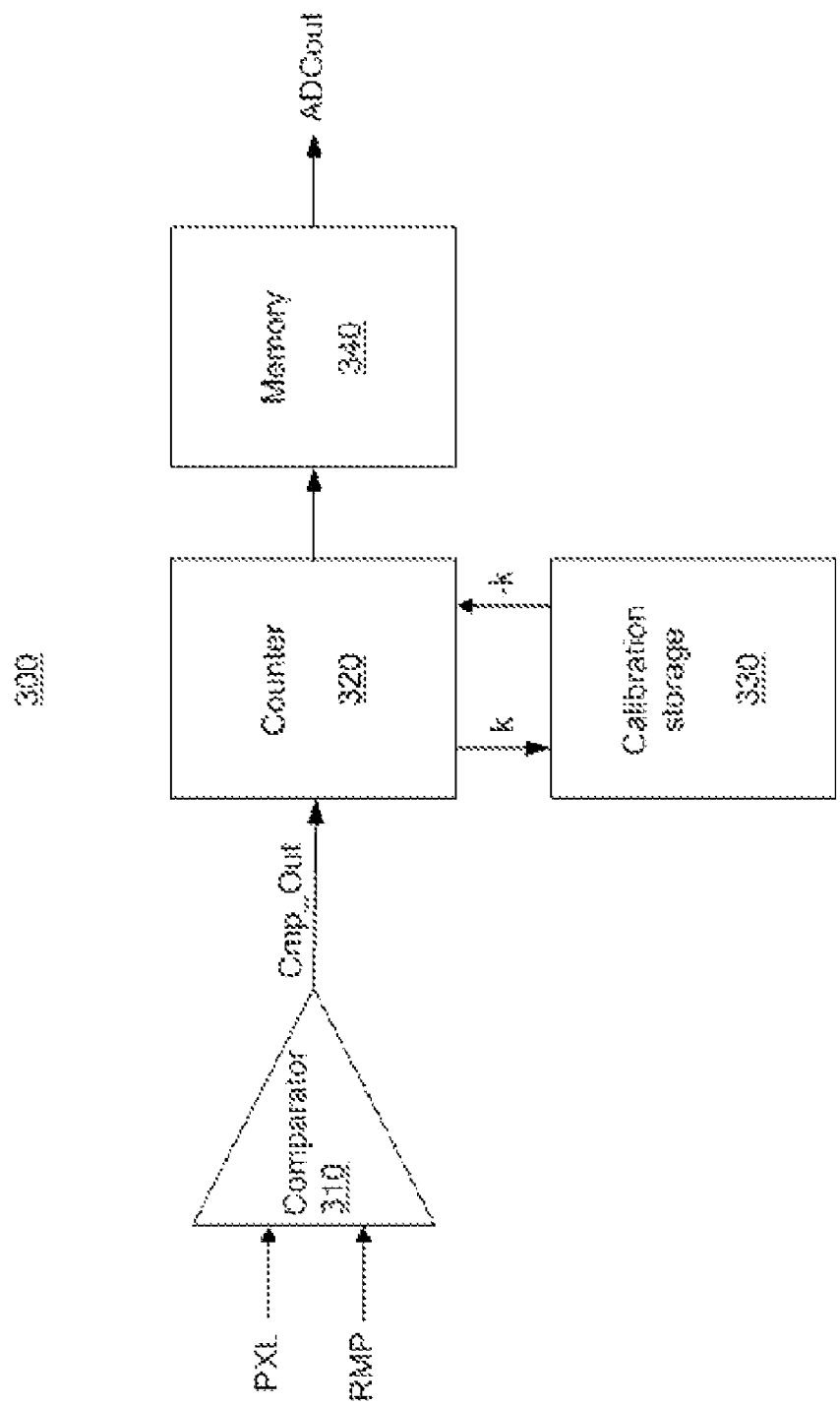
FIG. 3 is a block diagram of an exemplary system for analog to digital conversion, in accordance with an embodiment of the present invention.

FIG. 3 is a block diagram of an exemplary system for analog to digital conversion in accordance with an embodiment of the present invention. Referring to FIG. 3, there is shown an ADC element 300, which may be similar to the ADC element 211, comprising comparator 310, counter 320, calibration memory 330, and memory block 340.

The comparator 310 may have as inputs a pixel signal PXL from, for example, the pixel array 200, and a ramp signal RMP from, for example, the control logic 130. The comparator 310 may compare the input signal PXL and assert an output Cmp_Out when the ramp signal RMP and the pixel signal PXL are substantially equal to each other. The counter 320 may be an up-counter that receives a load signal LD, an enable signal EN, a clear signal CLR, and a clock signal CLK from, for example, the control logic 130. The various command signals such as LD, EN, CLR, CLK, etc. are not shown in FIG. 3. If needed, the counter 320 may be loaded with a value and, when enabled by the enable signal, start counting from the loaded value with each rising edge of the clock signal. The clear signal CLR may be equivalent to loading the counter with a value of zero.

The calibration storage 330 may comprise suitable circuitry for storing a calibration value. The calibration memory 330 may comprise, for example, circuitry that has inverted outputs and non-inverted outputs. This calibration value may be loaded into the counter 320 with the load signal LD received from, for example, the control logic 130. The memory block 340 may comprise suitable circuitry for storing digital values corresponding to the input pixel signal where the digital values are outputs of the counter 320. The memory block 340 may be of various sizes depending on implementation. The memory block 340 may be, for example, large enough to hold the digital values corresponding to a row of pixels.

In operation, there may be two phases of operation for the ADC element 300. One phase is the calibration phase, and the other phase is the conversion phase. During the calibration phase, the comparator 310 may be reset via a reset signal or an auto zero signal AZ from, for example, the control logic 130, and the pixel signal PXL may be set to a calibration voltage. The calibration voltage may be from, for example, the pixel array 200 where an additional switch element 202 may be closed to output the calibration voltage to the respective ADC element 211. The calibration voltage may have been determined, for example, during manufacturing of the comparators 310. The counter 320 is cleared to zero and enabled to count via the clear signal CLR and the enable signal EN, respectively.

The input ramp signal RMP may start to ramp down, and the counter 320 may start to count via the running clock signal CLK. When the ramp signal RMP is substantially the same voltage as the voltage of the input signal PXL, the comparator 310 asserts its output signal Cmp_Out. The asserted output signal Cmp_Out from the comparator 310 may be used to disable counting by the counter 320. The count from the counter 320 is then saved in the calibration memory 330. This stored count may be used for calibration offset when converting the input signal PXL to equivalent digital values during the conversion phase.

Additionally, various embodiments of the present invention may allow the counter 320 to start counting after a first period of the running clock signal CLK. Accordingly, the count value of k is counted by the counter 320 according k number of actual CLK cycles in the time from start of the ramp signal RMP to when the ramp signal RMP is substantially the same voltage as the input signal PXL. The count value k is then stored in the calibration storage 330.

During the conversion phase, an inverted value −k of the stored count k in the calibration memory 330 may be loaded into the counter 320. Therefore, during the conversion phase, the counter 320 first counts the calibration offset to reach a count of zero and then starts counting from zero to convert the input signal PXL to an equivalent digital value where the offset is automatically taken into account.

Figure 4:
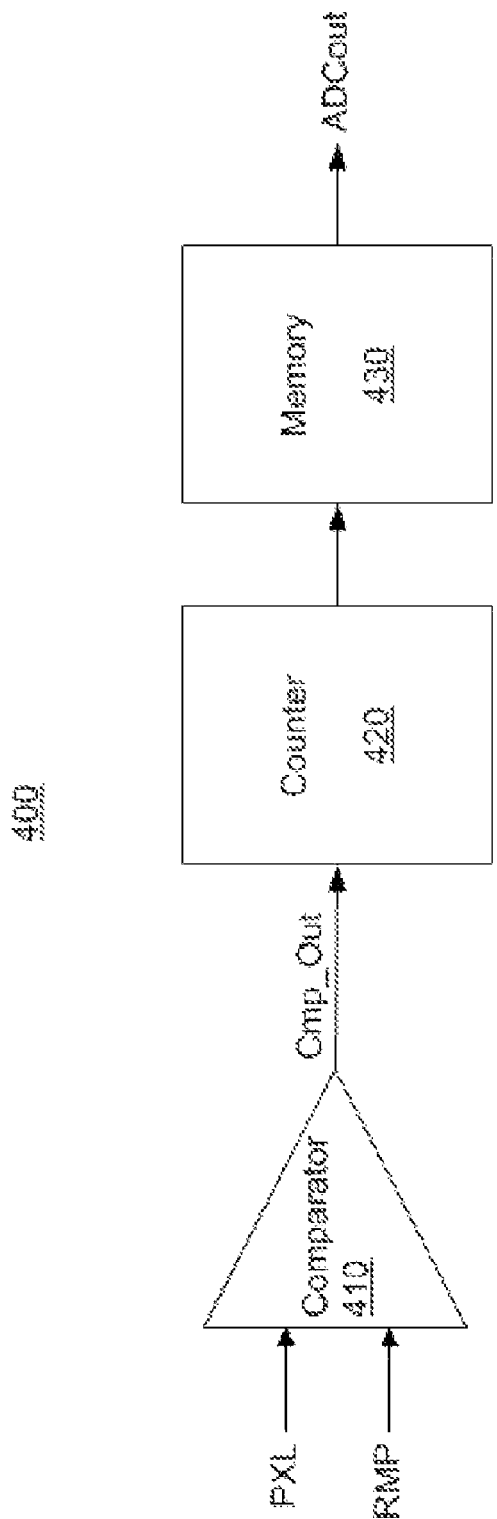
FIG. 4 is a block diagram of an exemplary system for analog to digital conversion, in accordance with an embodiment of the present invention.

FIG. 4 is a block diagram of an exemplary system for analog to digital conversion in accordance with an embodiment of the present invention. Referring to FIG. 4, there is shown an ADC element 400, which may be similar to the ADC element 211, comprising a comparator 410, a counter 420, and a memory 430. The comparator 410, the counter 420, and the memory 430 may be similar to the corresponding modules described with respect to FIG. 3. Again, various command signals are not shown.

Figure 5:
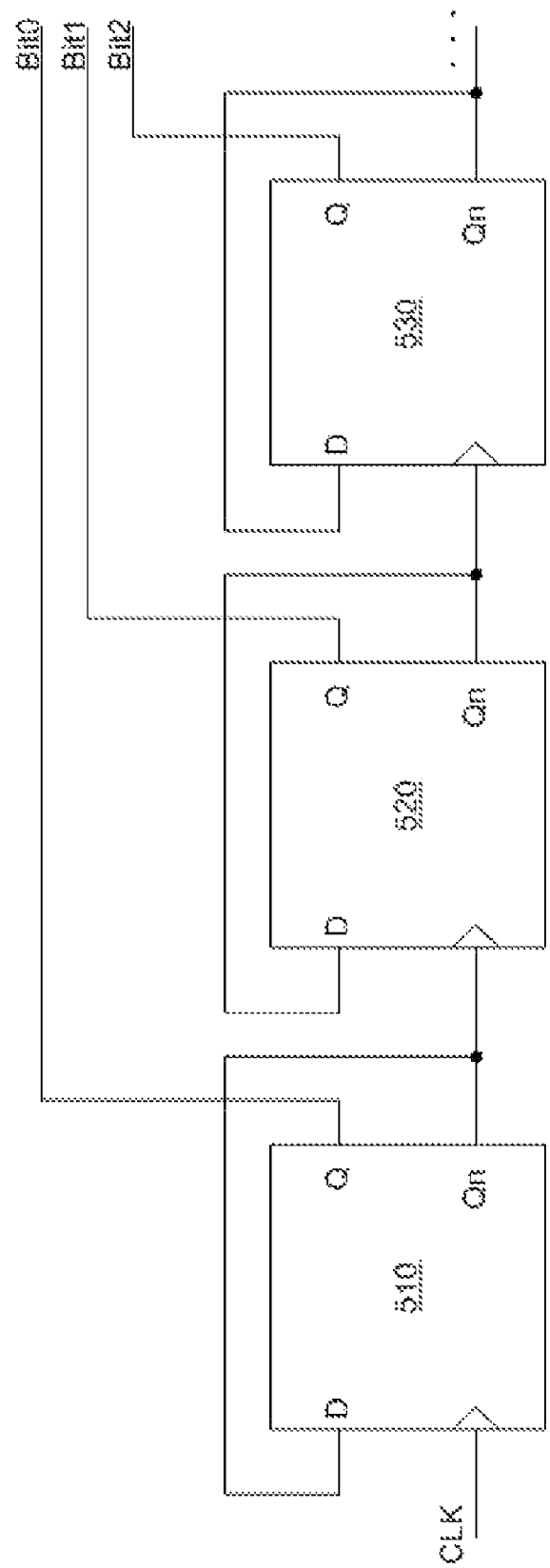
FIG. 5 is a block diagram of an exemplary comparator architecture, in accordance with an embodiment of the present invention.

FIG. 5 is a block diagram of an exemplary ripple up counter. Referring to FIG. 5, there is shown a simple ripple counter comprising D flip-flops 510, 520, 530. An input clock may drive the first D flip-flop 510, and the non-inverted output Q may be a least significant bit Bit0 of the counter. The inverted output Qn of the D flip-flop 510 is the clocking signal for the next D flip-flop 520. The Q output of the D flip-flop 520 is the next least significant bit Bit1. Additional D flip-flops may be added to the circuit for the desired number of count bits.

While an asynchronous counter has been described, the present invention need not be so limited. For example, a synchronous counter can also be used. However, a synchronous counter may require more circuitry than an asynchronous counter. Also, various features of a counter have not been shown. For example, depending on an application, it may be desirable for a counter to be able to load a value from which to start count, to be able to clear the counter to zero, and to have an enable signal to control the counter.

Figure 6:
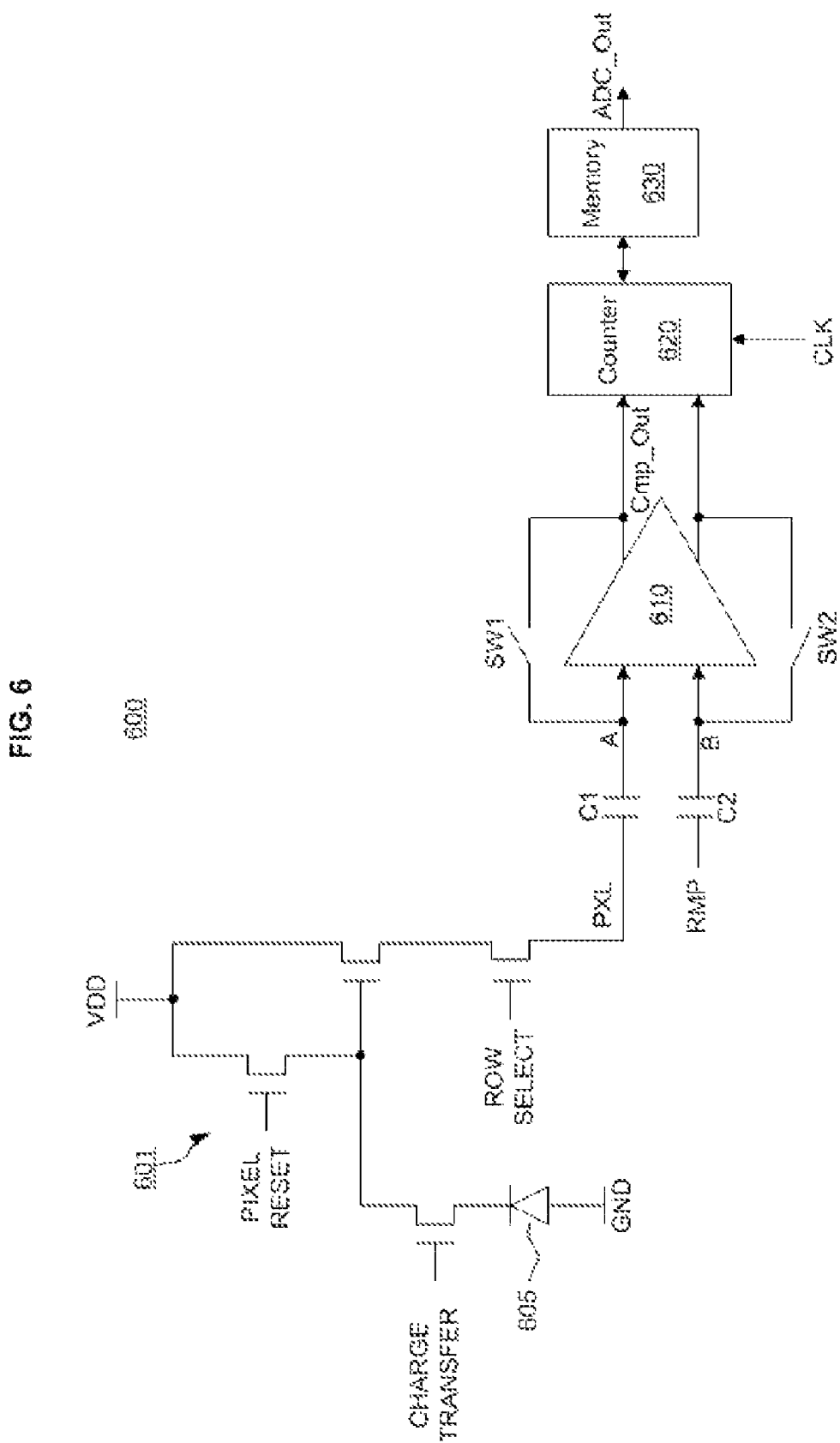
FIG. 6 is a circuit diagram of an exemplary system for analog to digital conversion system in accordance with an embodiment of the present invention.

FIG. 6 is a circuit diagram of an exemplary system for analog to digital conversion system 600 in accordance with an embodiment of the present invention. Referring to FIG. 6, the analog to digital conversion system 600 may comprise a pixel unit 601 (which may be similar to pixel 161 in FIG. 1B), a column parallel ADC 602 (which may be similar to an ADC in the ADC array 170 in FIG. 1B or to an ADC 211 of the ADC array 210 in FIG. 2), a counter 620, and memory 630.

The pixel unit 601 as shown in FIG. 6 is of a four-transistor image sensor structure according to an embodiment of the present invention. However, the present invention need not be so limited. Other transistor configuration is also possible to sufficiently output a pixel output signal PXL. A particular pixel unit among a plurality of pixel units 161 in the pixel array 160 in FIG. 1B may be selected by asserting a high state input signal to the ROW SELECT. When a low state signal is input to PIXEL RESET, an analog voltage signal corresponding to the photo image input to the photodiode 605 is outputted as the pixel output signal PXL. When a high state signal is input as PIXEL RESET, a reset voltage Vrst is outputted as the pixel output signal PXL. The reset voltage Vrst outputted as PXL may represent the dark state where no analog signal component from the photodiode 605 is asserted to the pixel output signal PXL.

In FIG. 6, there is shown a single stage comparator element 601, which may be similar to the comparator element 211, comprising a comparator 610, coupling capacitors C1, C2 and switching elements SW1, SW2. While a single-stage comparator 610 is shown in FIG. 6, the present invention need not be so limited. Various types of comparators including double-stage or other multi-stage (whether single-ended or differential) can be used to compare voltage levels of two input signals.

Figure 7:
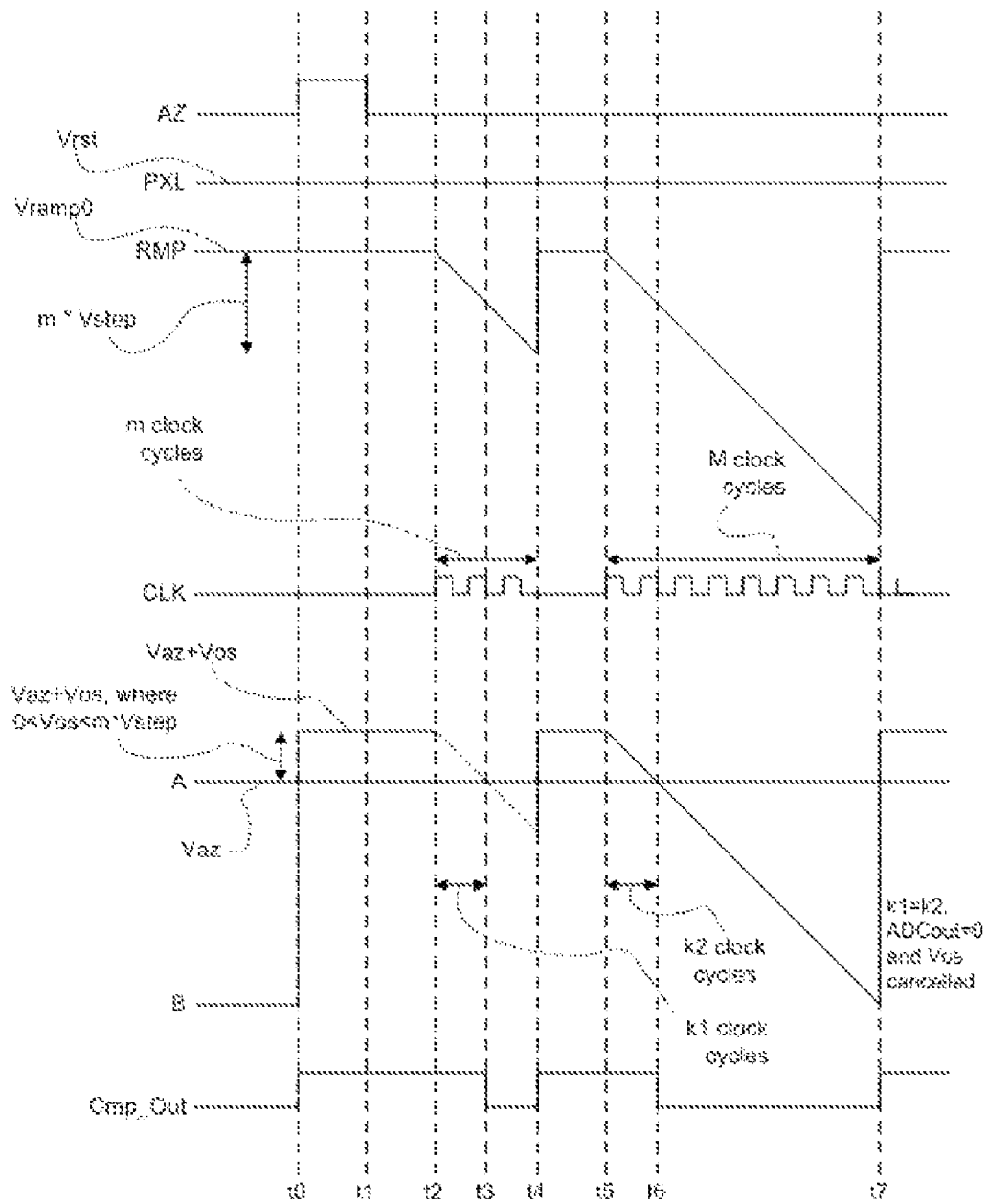
FIG. 7 is a timing diagram showing a calibration process for a comparator in a column-parallel ADC according to an embodiment of the present invention.

Start with a calibration row where all pixels are in reset mode all the time (that is, Vrst is applied to PXL input of the comparator), and now referring to FIGS. 6 and 7, the switching elements SW1 and SW2 may be closed to start a calibration phase by auto-zeroing the comparator 610 with a command AZ output at t0 from, for example, the control logic 130 to reset the inputs PXL and RMP of the comparator 610 to known states. By asserting a high state signal to PIXEL RESET, the pixel element 601 is kept in a dark state or the analog signal from the photodiode 605 is prevented from being asserted to the comparator 610. Instead, a reset voltage Vrst is asserted to the PXL input of the comparator 610, and an auto zero voltage Vaz would be present at the node A.

Figure 9:
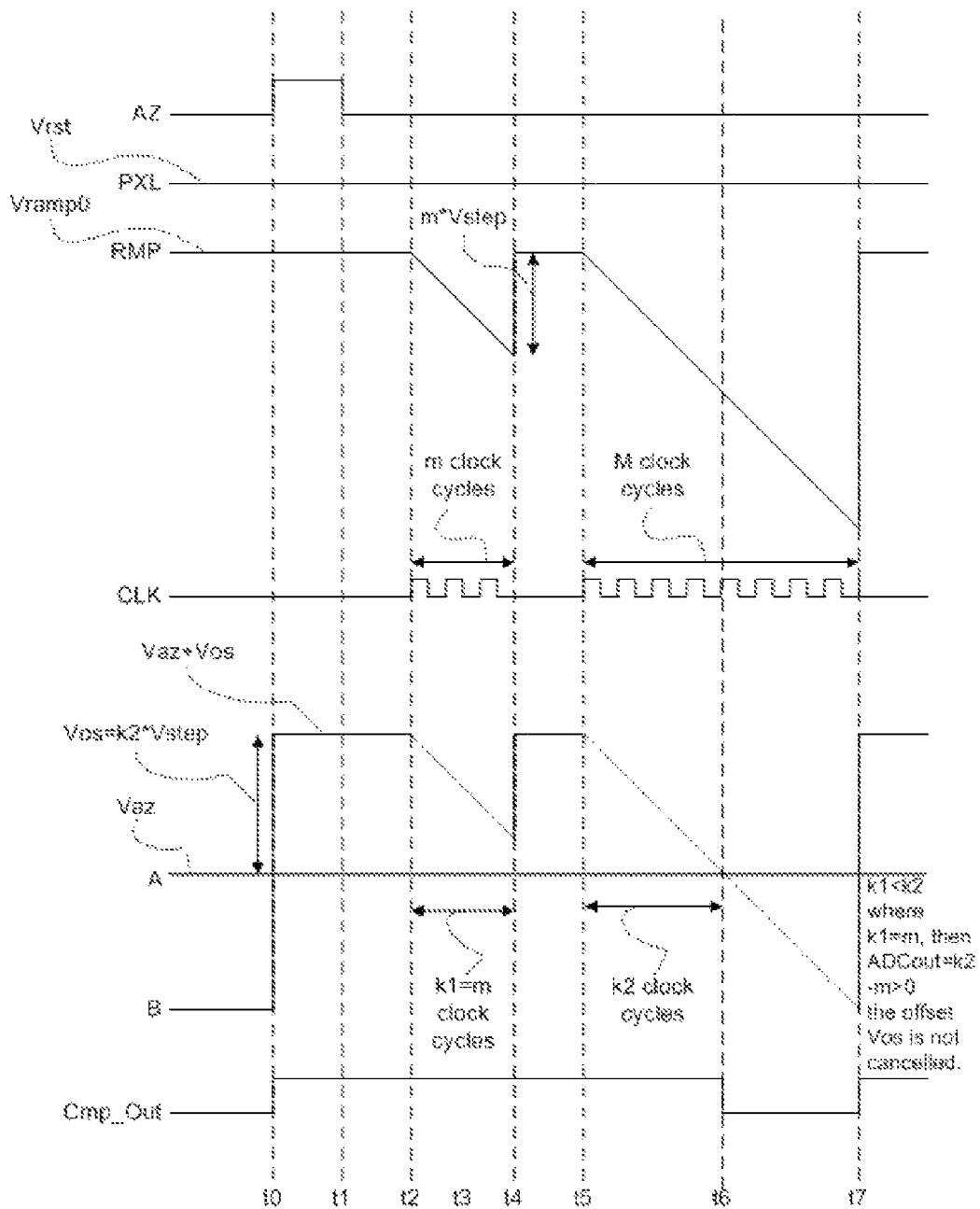

A calibration row is shown in FIG. 9 and refers to the calibration operations performed during t0-t7, in which the reset voltage Vrst is always asserted to the PXL input of the comparator. The time period t1-t4, in which a first ramp down is performed, is referred to as a calibration phase, and the time period t4-t7 is referred to as a conversion phase.

A ramp signal having a ramp start voltage Vramp0 is asserted to the input RMP to the comparator 610. At node B input of the comparator 610, a voltage is applied that equals the sum of the auto zero voltage Vaz and the comparator offset voltage Vos (i.e., Vaz+Vos). Vos is the offset voltage present in the ADC, which is a component contributing to CFPN, unless this Vos element is subtracted out in the conversion phase.

FIG. 7 is a timing diagram showing an ideal calibration process. For calibration of the comparator in a column-parallel ADC, PIXEL RESET is set to a high state so that no pixel signal is applied to the comparator. At t0, the comparator is auto-zeroed (i.e., AZ=1) by closing the switches SW1, SW2. Then, a reset voltage Vrst (representing the dark image of the pixel) is applied to the PXL input of the comparator. A ramp signal having a ramp start voltage Vrmp0 is applied to the RMP input of the comparator. Then, the voltage at node A is an auto zero voltage Vaz, and the voltage at node B is Vaz+Vos.

The calibration phase continues by resetting the auto zero signal AZ to a low state at t1 as shown in FIG. 7, which as a result opens the switches SW1 and SW2. At t2, the ramp signal begins to ramp down from the ramp start voltage Vramp0 by a step voltage Vstep for every clock cycle CLK. In an embodiment of the present invention, the ramping down operation would continue up to a predetermined number of clock cycles m. That is, the ramping down operation will continue until t4 as the total number of clock cycles inputted to the counter 620 between t2-t4 is m.

At t3, however, the voltages at the input nodes A and B of the comparator 610 are equal and this would cause the comparator 610 to toggle the comparator output signal Cmp_Out from a high state to a low state. This will in turn cause the counter 620 to stop counting and store the count value k1 at the memory 630.

Then the count value k1 is converted into −k1 and is loaded back into the counter 620.

The calibration phase continues by performing a second ramping down operation at t5. The second ramping down operation is performed for M number of clock cycles where M is greater than m. At t6, the ramp signal begins to ramp down from the ramp start voltage Vramp0 by a step voltage Vstep for every clock cycle CLK up to a predetermined number of clock cycles M. Thus, the ramping down operation will continue until t7 as the total number of clock cycles inputted to the counter 620 between t5-t7 is M.

At t6, however, the voltages at the input nodes A and B of the comparator 610 are equal and this would cause the comparator 610 to toggle the comparator output signal Cmp_Out from a high state to a low state. This will in turn cause the counter 620 to stop counting at t6. In the time period between t5 and t6, a total of k2 clock cycles were counted by the counter 620. For this second counting operation, the counter 620 was preset with a count value of −k1. Thus, the final count value would equal k2−k1. In an ideal situation, k2 would equal k1 as the slopes of the first and second ramps equal. When 0=k2−k1, the offset voltage Vos that was present in the comparator 610 of the ADC 600 has been cancelled out.

Figure 8:
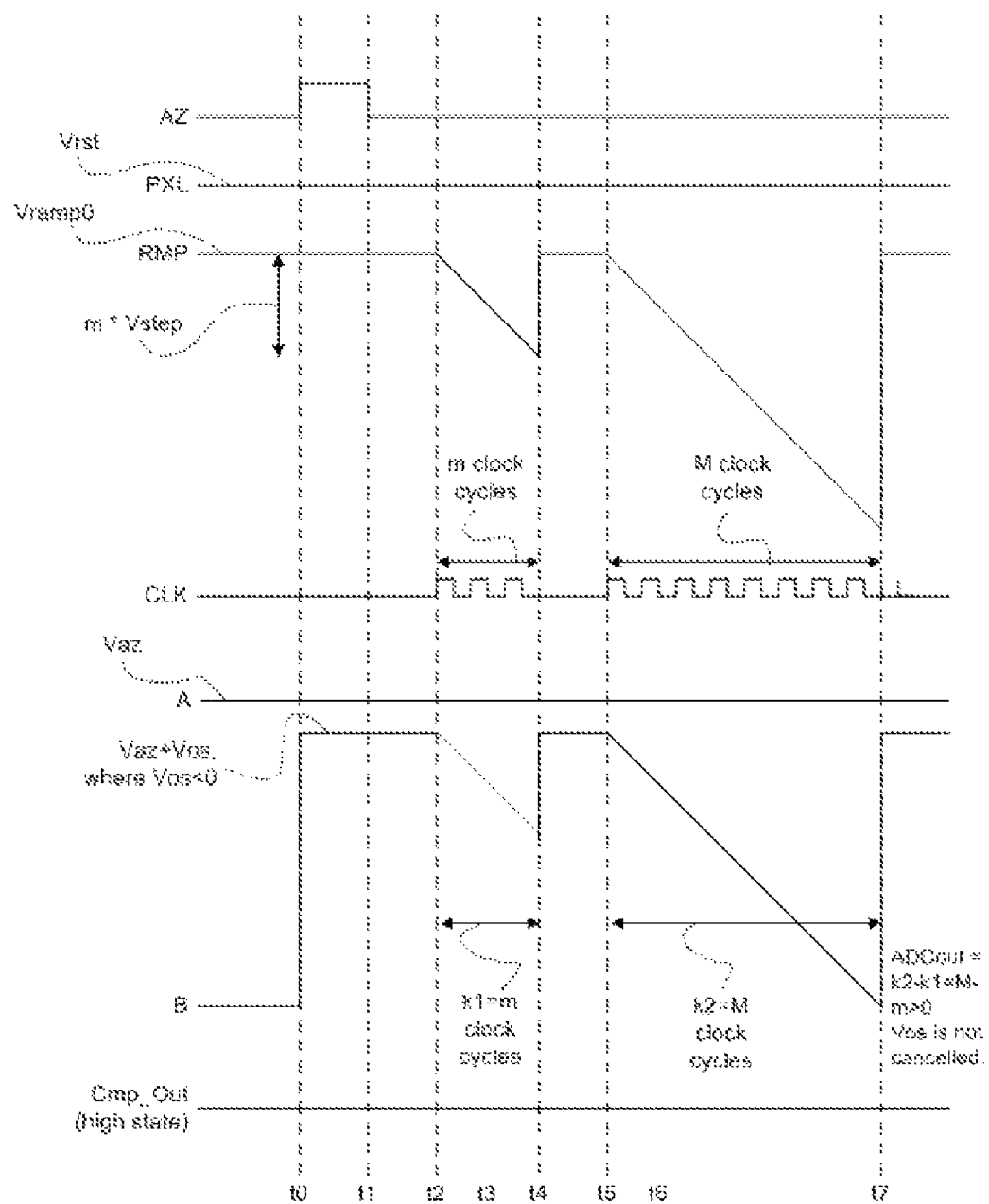
FIGS. 8-9 are timing diagrams showing non-ideal situations for which a solution is provided in accordance with an embodiment of the present invention.

However, such an ideal situation as described above with respect to FIG. 7 does not repeat always in a real operating situation. Now referring to FIG. 8, there may be a situation where a negative offset voltage (i.e., Vos<0) may be found at the input node B of the comparator. Then, as shown in FIG. 8, the auto zero voltage Vaz appearing at the input node A during all facets of the calibration phase between t0 to t7 would be higher than the maximum voltage (which is Vaz+Vos, where Vos<0) found at the input node B of the comparator 610.

This is mostly problematic because the voltages at the input nodes A and B of the comparator 610 will never cross during the ramping down operations at the time periods t2-t4 and t5-t7. Therefore, during the first ramp down of t2-t4, the counter will count m clock cycles (that is, k1=m), and during the second ramp down of t5-t7, the counter will count M clock cycles (that is, k2=M). This results in the first counter value k1 not equaling the second counter value k2. More specifically, k2−k1 would be greater than zero (or M−m>0), which means that the offset Vos found at the input node B of the comparator 610 cannot be cancelled. The comparator output Cmp_Out will remain at a high state and will not toggle into a low state any time during the calibration phase of t0-t7.

In another problematic situation, which is shown in FIG. 9, the voltages at the nodes A and B may not cross during the first ramp down period of t2-t4 but cross only at t6 during the second ramp down period of t5-t7. Since k2 is greater than k1 where k1=m, the ADCout equals to k2−m where k2−m>0. Thus, Vos cannot be cancelled.

Figure 10A:
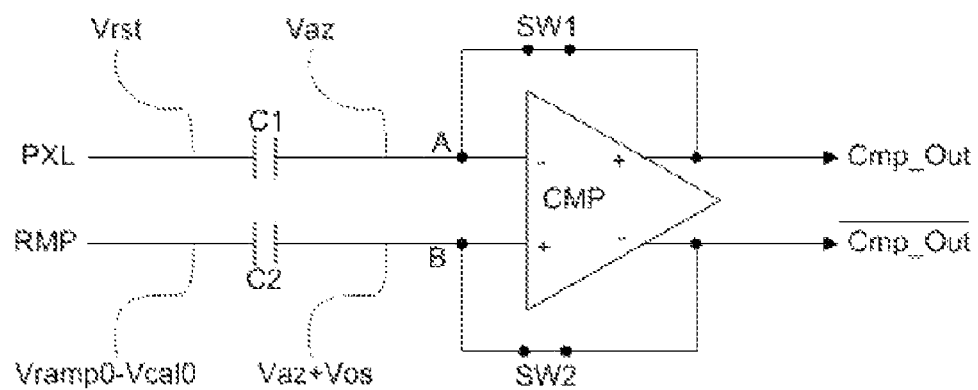
FIGS. 10A-10B are circuit diagram showing input voltages to a comparator for providing a solution to the problems described in reference to FIGS. 8-9 in accordance with an embodiment of the present invention.

To overcome these problems, an embodiment of the present invention described below with respect to FIGS. 10-12 utilizes an initial calibration offset voltage Vcal0. That is, referring to FIG. 10A, the initial calibration offset voltage of Vcal0 is additionally introduced. Instead of applying the ramp start voltage Vramp0 to the RMP input of the comparator 610, Vramp0-Vcal0 is asserted to RMP input of the comparator 610 during a calibration phase. During an auto zero operation between the time period t0-t1, an auto zero voltage Vaz would be present at the input node A of the comparator 610 (see FIG. 10A), and an auto zero voltage Vaz in addition to the offset voltage Vos (that is, Vaz+Vos) would be present at the input node B of the comparator 610.

Figure 10B:
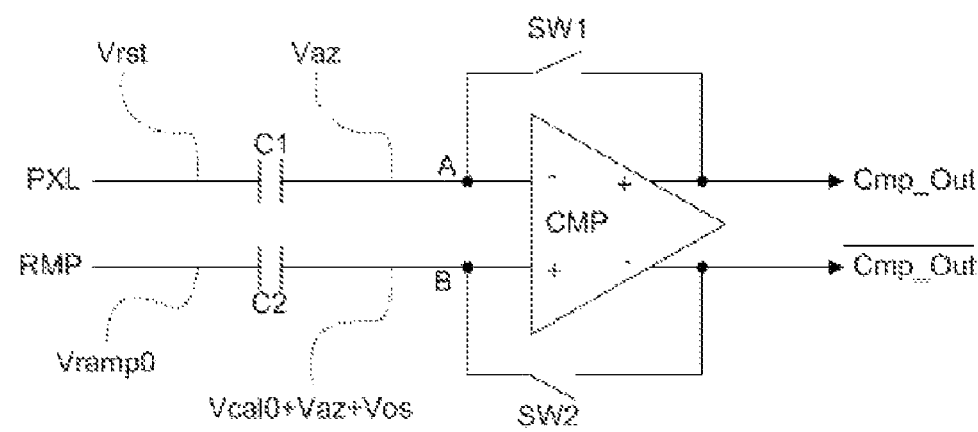

When the comparator 610 is taken out of the auto zero operation (that is, switches SW1 and SW2 are open) as shown in FIG. 10B, the node RMP is raised back to Vramp0, while PXL remains at Vrst. As a result, an auto zero voltage Vaz would be found at the input node A of the comparator 610, and the sum of the auto zero voltage Vaz and the offset voltage Vos and the initial calibration voltage Vcal0 (that is, Vaz+Vos+Vcal0) would be present at the input node B of the comparator 610. This is shown in the time period t1-t2.

When choosing an initial calibration voltage value Vcal0, the value of Vcal0 is chosen large enough that would cause the first count value k1 to reach m. In other words, as shown in the time period t2-t4 of FIG. 11, the first ramp down voltage at the input node B will not cross the Vaz voltage present at the input node A of the comparator 610. At the end of the m clock cycles at t4, the voltage at the input node A would be higher than the Vaz voltage found at the input node A of the comparator 610. The difference in the voltages at the nodes A and B at t4 of FIG. 11 is designated as Vdelta.

Then the second ramp down operation is performed during the time period t5-t7 for M number of clock cycles, where M is greater than m. Because M is greater than m, the second ramp down voltage at the node B will cross the Vaz voltage at the node A at t6. At t6, the output comparator voltage Cmp_Out will toggle into a low state and triggers the counter 620 to stop the counting operation. At t6, a count value of k2-m would be stored in the counter 620.

The difference voltage Vdelta at t4 can be calculated by multiplying a step voltage Vstep and the difference in the k2 and m clock cycles, that is, Vdelta=(k2−m)*Vstep. Vdelta can be calculated in this manner because the slopes of the first and second ramp down voltages are same.

Figure 11:
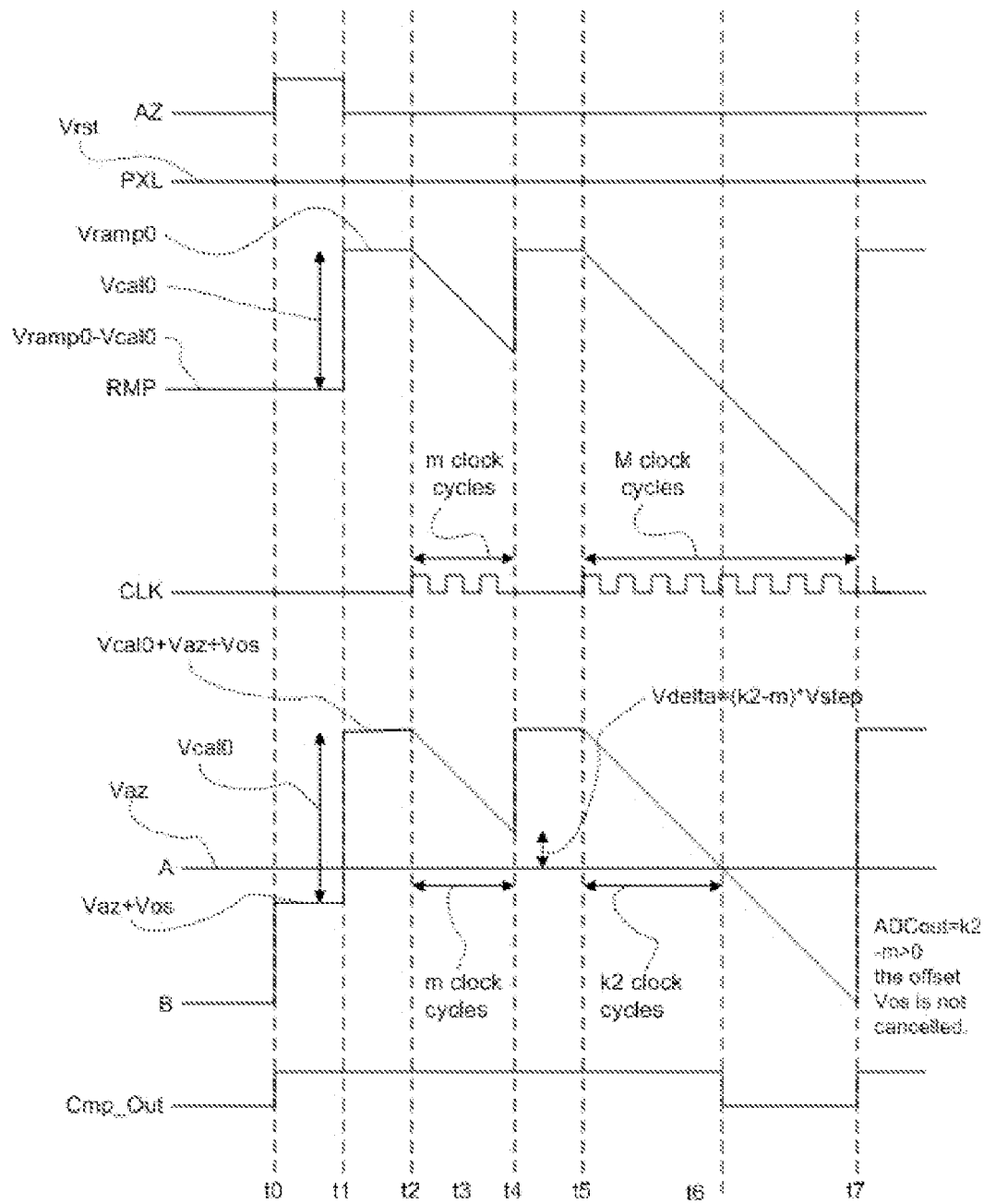
FIGS. 11-12 are timing diagrams showing a solution to the problems described in reference to FIGS. 8-9 in accordance with an embodiment of the present invention.
Figure 12:
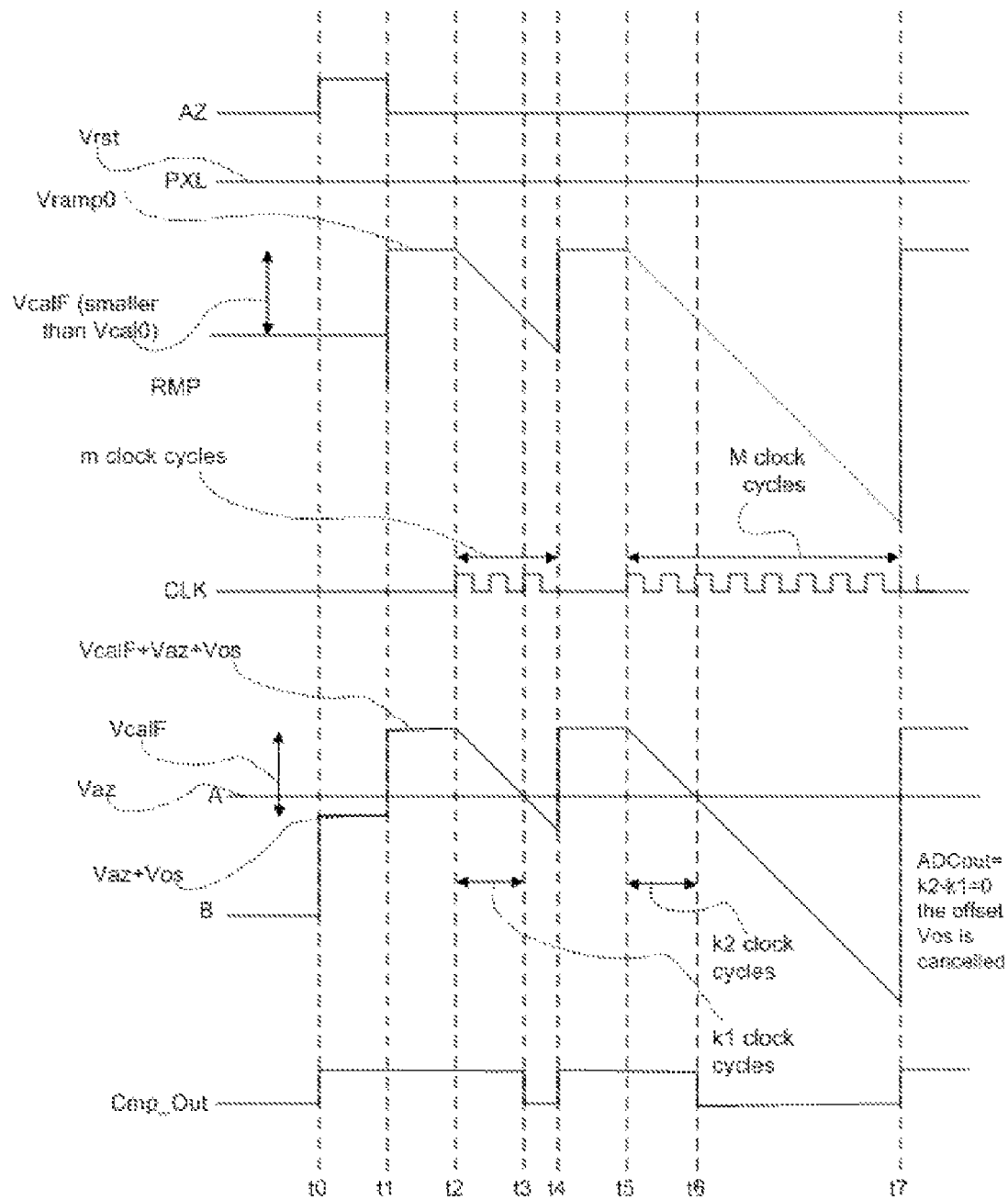

Upon calculating Vdelta, a final calibration voltage VcalF (FIG. 12) can be determined to ensure that the voltage curve at the input node A of the comparator 610 as shown in FIG. 11 can be shifted downward so that the first ramp down voltage will sufficiently cross over the Vaz voltage at the input node A at t4. To do this, the final calibration voltage VcalF can be determined to be the sum of the initial calibration voltage Vcal0 and the difference voltage Vdelta plus a small additional voltage Vextra, that is, VcalF=Vcal0−Vdelta−Vextra.

Furthermore, m is chosen such that m is greater than the difference between the maximum and minimum ADC output values (that is, ADCoutmax−ADCoutmin<m) among the plurality of ADCs in the array. That is, the clock cycle m is greater than the maximum to minimum range of all ADCout values determined at each column parallel ADC in the array of ADCs. If, however, ADCoutmax−ADCoutmin>=m, then m should be increased and repeat the operations described above with respect to FIG. 11.

Then, it may be advantageous that Vdelta is determined from the ADC element in the ADC array having the maximum ADC output value ADCoutmax.

The difference voltage Vextra may be calculated by the following equation:

Vextra<[m−(ADCoutmax−ADCoutmin)]*Vstep.

Now referring again to FIG. 12, upon determining the final calibration voltage VcalF, the ADC is ready for active row operations.

In active row operation, similar operations of calibration phase as described with respect to FIG. 7 is performed with the real pixel analog signal introduced at the PXL input of the comparator and a final calibration voltage VcalF asserted at the RMP input of the comparator. For example, during t1-t4 (but assuming a conversion phase instead of a calibration phase), the voltage at the PXL input would equal the reset voltage Vrst of the pixel, and during t4-t7, the voltage at the PXL input would equal the real pixel analog signal Vsignal introduced at the PXL.

However, the present invention is not so limited in requiring a separate calibration storage such as 330. Same concept of calibration phase operation can be applied to the ADC element 400, which is without a calibration storage 330. The calibration phase operations without utilizing a separate calibration storage 330 are explained in detail below with respect to FIGS. 13-17 in accordance with an embodiment of the present invention.

Figure 13:
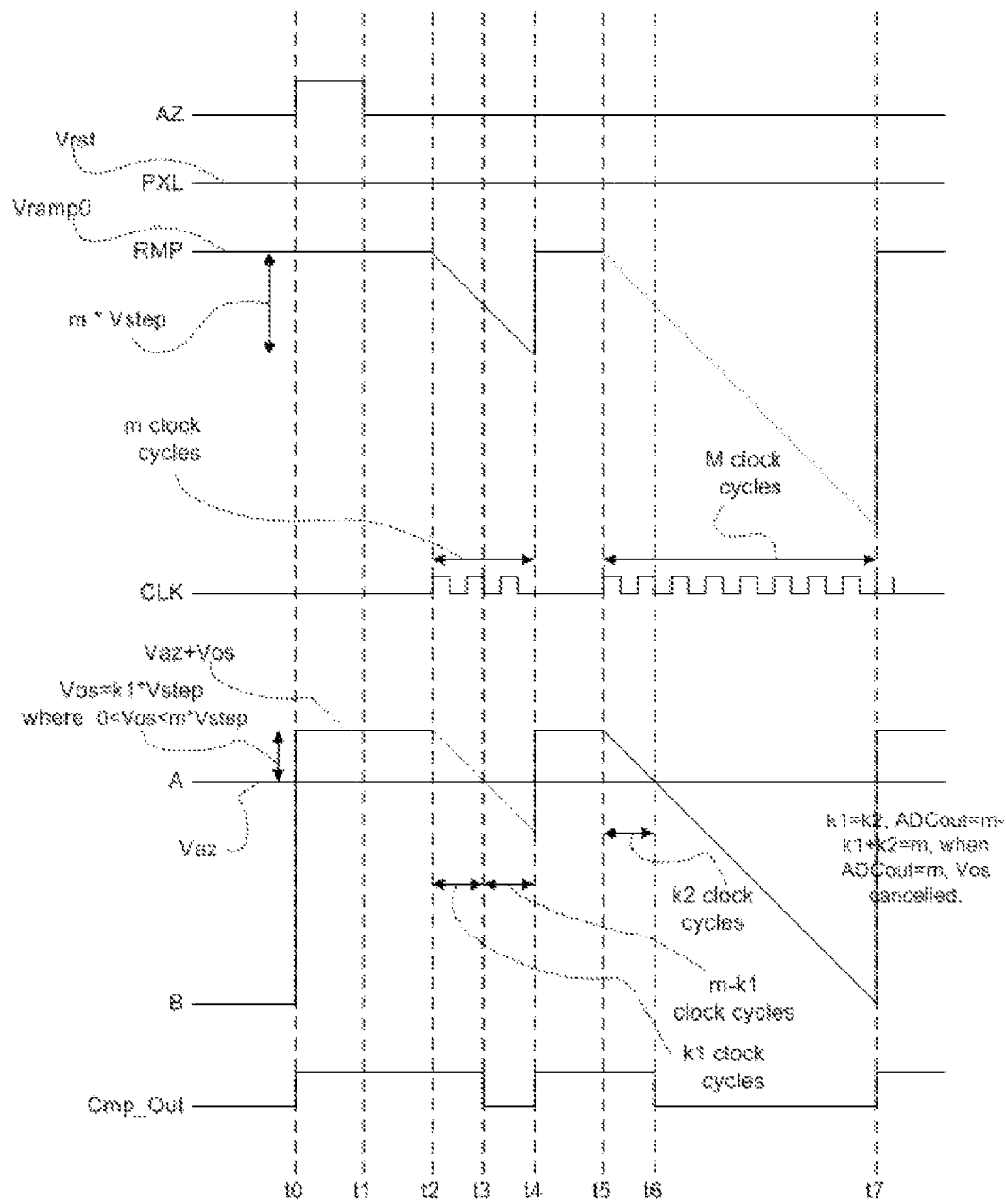
FIG. 13 is a timing diagram showing a calibration process for a comparator in a column-parallel ADC according to an embodiment of the present invention.

Referring to FIG. 13, because there is not a separate calibration storage, the counting operation does not start until after the voltages at the nodes A and B are equal (that is, at t3). In an ideal situation, which is shown in FIG. 13, the voltage at node B is the sum of the auto zero voltage Vaz and the offset voltage Vos (i.e., Vaz+Vos). When the voltage at B ramps down to Vaz at t3, the counter 620 will start to count until the m-th clock cycle is inputted at t4. The total clock cycles inputted during t3-t4 are m−k1, and thus the count value of m−k1 is retained in the counter 620.

Figure 14:
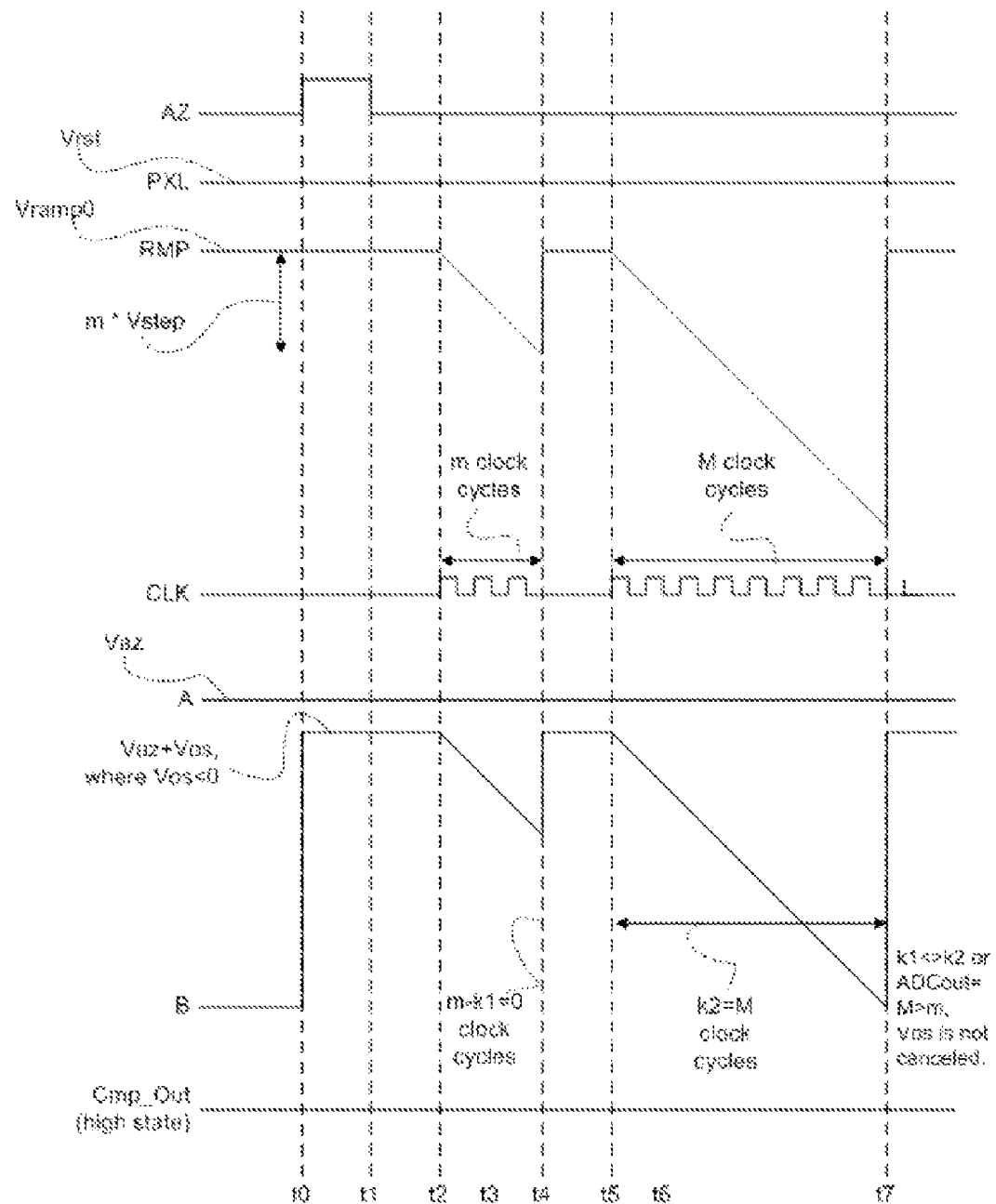
FIGS. 14-15 are timing diagrams showing non-ideal situations for which a solution is provided for in accordance with an embodiment of the present invention.

Then, now referring to FIG. 14, the second ramp down is performed during t5-t7, and in this case, the counter starts to count during t5-t6. k2 number of clock cycles are inputted during t5-t6. The counter 620 starts counting k2 clock cycles beginning from m−k1. Thus, the ADCout would be k2+m−k1, and, since k1=k2 because the slopes of the first and second ramps during t2-t4 and t5-t7 are same, the ADCout would equal to m (i.e., ADCout=m). The final count value of m would be output to the memory 430 and would signify the undesired offset voltage Vos has been cancelled.

Nevertheless, the real operating environment is not always ideal. Referring to which is similar to a non-ideal situation as described above with respect to FIG. 8, a negative offset voltage (i.e., Vos<0) is present in an ADC element such that the comparator output signal Cmp_Out would never change state to start a counting operation. The counter 420 will not count during the first ramp down (i.e., see t4) but will count to M during the second ramp down during t5-t7. This non-ideal situation is then identified when the ADC output signal ADCout equal M where M is greater than m (i.e., ADCout=M, where M>m). Because the ADC output signal ADCout does not equal to m, the offset voltage Vos which contributes to undesired noise such as CFPN cannot be cancelled.

Figure 15:
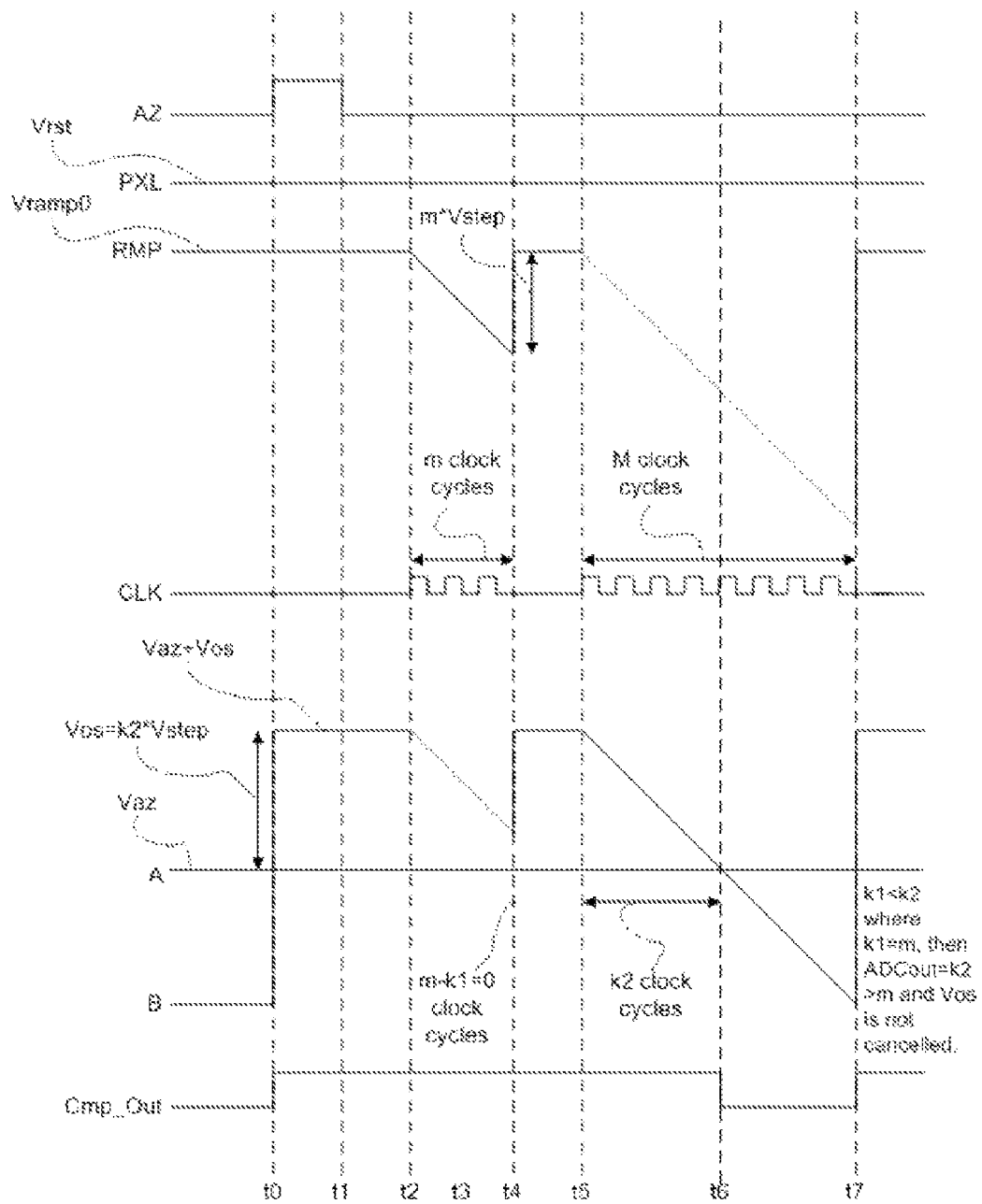

Referring to FIG. 15, which is another non-ideal situation as described above with respect to FIG. 9, it may be the case where the offset voltage Vos is too large to perform a counting operation during a first ramp down stage during t2-t4 but performs a counting operation during the second ramp down stage during t5-t7. The counter 420 will not count during the first ramp down (i.e., at t4) but will count to k2 during the second ramp down during t5-t7 where k2>m. This non-ideal situation is then identified when the ADC output signal ADCout equals to k2, where k2 is greater than m (i.e., ADCout=k2, where k2>m). Because the ADC output signal ADCout of k2 does not equal to m, the offset voltage Vos, which contributes to undesired noise such as CFPN, cannot be cancelled in this non-ideal situation.

Figure 16:
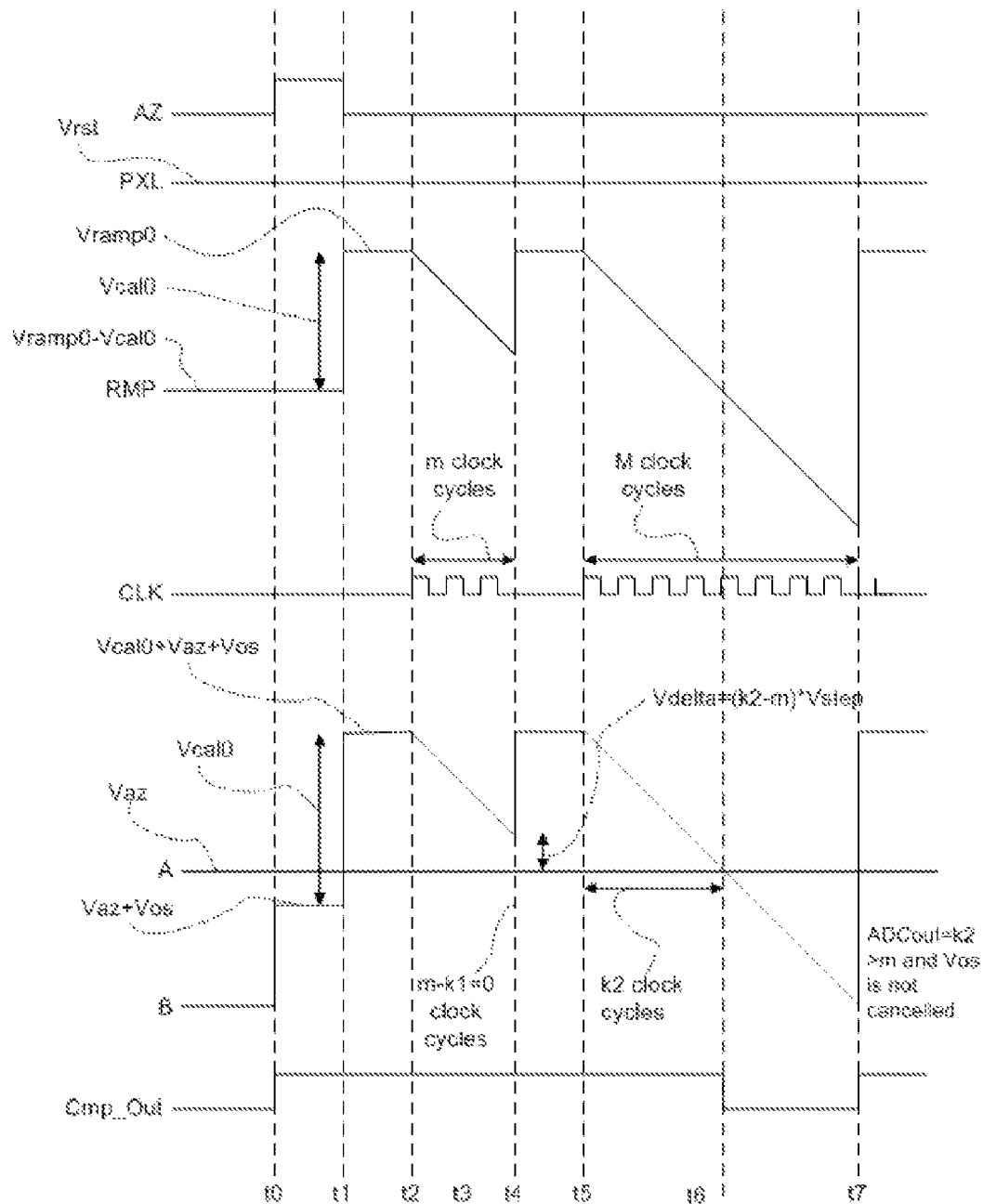
FIGS. 16-17 are timing diagrams showing a solution to the problems described in reference to FIGS. 14-15 in accordance with an embodiment of the present invention.
Figure 17:
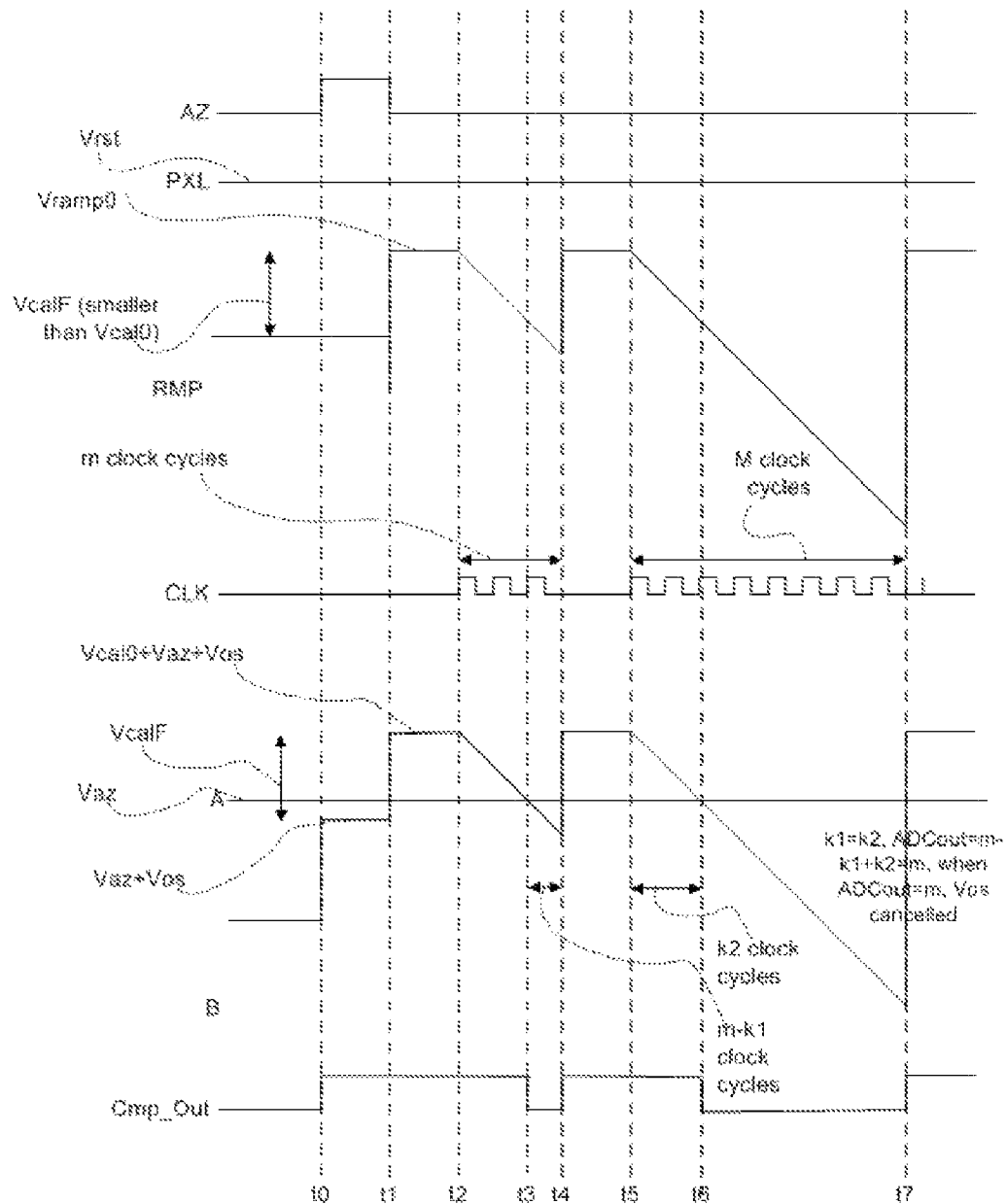

To overcome these problems, an embodiment of the present invention described below with respect to FIGS. 16-17 utilizes an initial calibration offset voltage Vcal0. That is, referring to FIG. 16, the initial calibration offset voltage of Vcal0 is additionally introduced, in addition to the ramp start voltage Vramp0 to the RMP input of the comparator (that is, Vramp0-Vcal0 is asserted to RMP input of the comparator during a calibration phase). During an auto zero operation between the time period t0-t1, an auto zero voltage Vaz would be present at the input node A of the comparator (see A in FIG. 16), and an auto zero voltage Vaz in addition to the offset voltage Vos (that is, Vaz+Vos) would be present at the input node B of the comparator (see B in FIG. 16).

When the comparator is taken out of the auto zero operation (that is, switches SW1 and SW2 are open) as shown in FIG. 10B, the voltage at the PXL input of the comparator would remain Vrst and the voltage at the RMP input of the comparator would rise up to Vramp0. This leads to an auto zero voltage Vaz present at the input node A of the comparator, and the sum of the auto zero voltage Vaz and the offset voltage Vos and the initial calibration voltage Vcal0 (that is, Vaz+Vos+Vcal0) would be present at the input node B of the comparator. This is shown in the time period t1-t2 of FIG. 16.

When choosing an initial calibration voltage value Vcal0, the value of Vcal0 is chosen that would likely cause the first counting operation at t4 would not commence. In other words, as shown in the time period t2-t4 of FIG. 11, the first ramp down voltage at the input node B will not cross the Vaz voltage present at the input node A of the comparator. At the end of the m clock cycles at t4, the voltage at the input node B would be higher than the Vaz voltage found at the input node A of the comparator. The difference in the voltages at the nodes A and B at t4 of FIG. 16 designated as Vdelta.

Then the second ramp down operation is performed during the time period t5-t7 for M number of clock cycles, where M is greater than m. Because M is greater than m, the second ramp down voltage at the node B will cross the Vaz voltage at the node A at t6. At t6, the output comparator voltage Cmp_Out will toggle into a low state from a high state and triggers the counter to stop the counting operation. At t6, a count value of k2 would be stored in the counter.

The difference voltage Vdelta at t4 can be calculated by multiplying a step voltage Vstep and the difference in the k2 and m clock cycles, that is, Vdelta=(k2−m)*Vstep. Vdelta can be calculated in this manner because the slopes of the first and second ramp down voltages are same.

Upon calculating Vdelta, a final calibration voltage VcalF can be determined to ensure that the voltage curve at the input node A of the comparator can be shifted downward so that the first ramp down voltage will sufficiently cross over the Vaz voltage at the input node A at t4. To do this and referring to FIG. 17, the final calibration voltage can be determined by reducing the initial calibration voltage Vcal0 by the difference voltage Vdelta plus a small additional voltage Vextra, that is, VcalF=Vcal0−(Vdelta+Vextra).

Furthermore, m is chosen such that m is greater than the difference between the maximum and minimum ADC output values (that is, ADCoutmax−ADCoutmin<m) among the plurality of ADCs in the array. That is, the clock cycle m is greater than the maximum to minimum range of all ADCout values determined at each column parallel ADC in the array of ADCs. If, however, ADCoutmax−ADCoutmin>=m, then m should be increased and repeat the operations described above with respect to FIG. 16.

Then, it may be advantageous that Vdelta is determined from the ADC element in the ADC array having the maximum ADC output value ADCoutmax.

The difference voltage Vextra may be calculated by the following equation:

$$V\text{extra} < [m-(\text{ADCoutmax}-\text{ADCoutmin})]*V\text{step}.$$

Now referring again to FIG. 17, upon determining the final calibration voltage VcalF, the ADC is ready for active row operations.

In active row operation, similar operations of calibration phase as described with respect to FIG. 7 is performed with the real pixel analog signal introduced at the PXL input of the comparator and a final calibration voltage VcalF asserted at the RMP input of the comparator. For example, during t1-t4 (but assuming a conversion phase instead of a calibration phase), the voltage at the PXL input would equal to the reset voltage Vrst of the pixel, and during t4-t7, the voltage at the PXL input would equal to the real pixel analog signal Vsignal introduced at the PXL.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method of using an analog to digital converter (ADC), comprising:
    applying, during a calibration cycle, an auto-zero voltage to first and second inputs of a comparator in the ADC during an auto-zero period;
    adding a first calibration voltage to the second input at the end of the auto-zero period;
    determining a difference voltage between the voltage at the second input at the end of the auto-zero period and the maximum voltage difference able to be determined at the second input during a calibration phase of the ADC;
    determining a calibration offset voltage greater than the difference voltage; and
    generating a second calibration voltage by reducing the first calibration voltage by the calibration offset voltage, wherein the second calibration voltage is applied to the second input during a conversion cycle.

2. The method of claim 1, comprising decreasing the voltage at the second input at a steady rate for a pre-determined calibration time.

3. The method of claim 2, comprising verifying, during the pre-determined calibration time, the comparator output logic level stays constant, wherein the constant comparator output logic level indicates that the voltage at the second input is greater than the voltage at the first input.

4. The method of claim 1, comprising applying the calibration offset voltage to the second input at the end of the auto-zero period of each calibration phase and conversion phase of a conversion cycle.

5. The method of claim 4, comprising decreasing the voltage at the second input at a steady rate for a pre-determined calibration time and a pre-determined conversion time.

6. The method of claim 5, wherein the pre-determined calibration time is less than the pre-determined conversion time.

7. The method of claim 5, comprising counting, during the calibration phase of the conversion cycle, an offset count of clock cycles required for the decreasing voltage at the second input to be less than the voltage at the first input.

8. The method of claim 7, wherein counting is up counting.

9. The method of claim 7, wherein the offset count is one less than the number of clock cycles required for the decreasing voltage at the second input to be less than the voltage at the first input.

10. The method of claim 7, comprising storing the offset count for use in the conversion phase.

11. The method of claim 10, comprising loading a counter with an inverted value of the stored offset count for use in the conversion phase of the conversion cycle, wherein by the counter counting up to zero from the inverted value of the stored offset count removes voltage error in the ADC, and the counter counting to a final count, when the comparator changes its output logic level, that is the digital equivalent of the voltage at the first input.

12. The method of claim 7, comprising counting down, during the calibration phase of the conversion cycle, an offset count of clock cycles required for the decreasing voltage at the second input to be less than the voltage at the first input.

13. The method of claim 12, comprising counting up, during the conversion phase of the conversion cycle, wherein the counter counting up to zero removes voltage error in the ADC detected in the calibration phase, and the counter counting to a final count, when the comparator changes its output logic level, that is the digital equivalent of the voltage at the first input.

14. An analog to digital converter (ADC), comprising:
a comparator in the ADC, wherein an auto-zero voltage is applied to first and second inputs of the comparator during an auto-zero period of a calibration cycle;
circuitry suitable to add a first calibration voltage to the second input at the end of the auto-zero period;
circuitry suitable to determine a difference voltage between the voltage at the second input at the end of the auto-zero period and the maximum voltage difference able to be determined at the second input during a calibration phase of the ADC;
circuitry suitable to determine a calibration offset voltage greater than the difference voltage; and
circuitry suitable to generate a second calibration voltage by reducing the first calibration voltage by the calibration offset voltage, wherein the second calibration voltage is applied to the second input during a conversion cycle.

15. The analog to digital converter of claim 14, wherein the voltage at the second input is decreased at a steady rate for a pre-determined calibration time.

16. The analog to digital converter of claim 15, comprising circuitry suitable to verify, during the pre-determined calibration time, that the comparator output logic level stays constant, wherein the constant comparator output logic level indicates that the voltage at the second input is greater than the voltage at the first input.

17. The analog to digital converter of claim 14, comprising circuitry suitable to apply the calibration offset voltage to the second input at the end of the auto-zero period of each calibration phase and conversion phase of a conversion cycle.

18. The analog to digital converter of claim 15, wherein the voltage at the second input is decreased at a steady rate for a pre-determined calibration time and a pre-determined conversion time.

19. The analog to digital converter of claim 18, wherein the pre-determined calibration time is less than the pre-determined conversion time.

20. The analog to digital converter of claim 18, comprising a counter suitable to count, during the calibration phase of the conversion cycle, an offset count of clock cycles required for the decreasing voltage at the second input to be less than the voltage at the first input.

21. The analog to digital converter of claim 20, wherein the counter is configured to count up.

22. The analog to digital converter of claim 20, wherein the counter is configured to count the offset count that is one less than the number of clock cycles required for the decreasing voltage at the second input to be less than the voltage at the first input.

23. The analog to digital converter of claim 20, comprising circuitry suitable to store the offset count for use in the conversion phase.

24. The analog to digital converter of claim 23, wherein the counter is loaded with an inverted value of the offset count for use in the conversion phase of the conversion cycle, wherein by the counter counting up to zero from the inverted value of the offset count removes voltage error in the ADC, and the counter counting to a final count, when the comparator changes its output logic level, that is the digital equivalent of the voltage at the first input.

25. The analog to digital converter of claim 20, wherein the counter is configured to count down, during the calibration phase of the conversion cycle, an offset count of clock cycles required for the decreasing voltage at the second input to be less than the voltage at the first input.

26. The analog to digital converter of claim 25, wherein the counter is enabled to count up during the conversion phase of the conversion cycle, wherein the counter counting up to zero removes voltage error in the ADC detected in the calibration phase, and the counter counting to a final count, when the comparator changes its output logic level, that is the digital equivalent of the voltage at the first input.

* * * * *